(12) United States Patent
Youssoufian et al.

(10) Patent No.: US 7,212,073 B2
(45) Date of Patent: May 1, 2007

(54) CAPACITIVE TUNING NETWORK FOR LOW GAIN DIGITALLY CONTROLLED OSCILLATOR

(75) Inventors: Edward Youssoufian, Irvine, CA (US); Aly M. Ismail, Newport Beach, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 149 days.

(21) Appl. No.: 11/049,560

(22) Filed: Feb. 2, 2005

(65) Prior Publication Data

US 2006/0170506 A1 Aug. 3, 2006

(51) Int. Cl.
*H03L 7/099* (2006.01)

(52) U.S. Cl. .................. 331/36 C; 331/179; 331/177 V

(58) Field of Classification Search .............. 331/36 C, 331/179, 177 V
See application file for complete search history.

(56) References Cited

U.S. PATENT DOCUMENTS

| 6,429,693 | B1 | 8/2002 | Staszewski et al. |
| 6,658,748 | B1 | 12/2003 | Leipold et al. |
| 6,882,064 | B2 * | 4/2005 | Glenn .................. 307/109 |

OTHER PUBLICATIONS

Staszewski et al, *Just-in-time Gain Estimation of an RF Digitally-Controlled Oscillator for Digital Direct Frequency Modulation*, 50 IEEE Transactions on Circuits and Systems, 887-892 (2003).

Lee, et al, *A 1.5V 28mA Fully-Integrated Fast-Locking Quad-Band GSM-GPRS Transmitter with Digital Auto-Calibration in 130nm CMOS*, §10.4, IEEE ISSCC (2004).

McMahill, et al, *A 2.5 MB/s GFSK 5.0Mb/s 4-FSK Automatically calibrated Sigma Delta Frequency synthesizer*, 37 IEEE Journal of Solid State Circuits, (Jan. 2002).

Staszewski et al, *All-Digital Phase Domain TX Frequency Synthesizer for Bluetooth Radios in 0.13um CMOS*, §15.3, IEEE ISSCC (2004).

\* cited by examiner

Primary Examiner—Joseph Chang
(74) Attorney, Agent, or Firm—Farjami & Farjami LLP

(57) ABSTRACT

According to one exemplary embodiment, a digitally controlled oscillator includes a capacitive tuning network, where the capacitive tuning network controls a frequency of an output signal of the digitally controlled oscillator. The capacitive tuning network includes a switched capacitor array, where a change of a first capacitance of the switched capacitor array causes the capacitive tuning network to change by a second capacitance, and where the first capacitance is larger than the second capacitance. According to this exemplary embodiment, the capacitive tuning network further includes a first capacitor coupled in parallel with the switched capacitor array. The first capacitor has a third capacitance, which is larger than the first capacitance. The capacitive tuning network further includes a second capacitor coupled in series with the first capacitor and the switched capacitor array. The second capacitor can have a fourth capacitance, where the third capacitance is larger than the fourth capacitance.

14 Claims, 2 Drawing Sheets

CAPACITIVE TUNING NETWORK FOR LOW GAIN DIGITALLY CONTROLLED OSCILLATOR

BACKGROUND OF THE INVENTION

1. Field of the Invention

The present invention is generally in the field of electrical circuits. More particularly, the invention is in the field of phase locked loops.

2. Related Art

Phase locked loops that are implemented with digital circuitry provide various advantages, such as increased reliability and ease of integration, compared to analog phase locked loops. In a digital phase locked loop, a digitally controlled oscillator is used in place of a voltage controlled oscillator for signal generation. A digitally controlled oscillator does not require a varactor diode for tuning, which saves a processing step and reduces mask cost compared to a voltage controlled oscillator.

However, in order to achieve a sufficiently high dynamic range, a digital phase locked loop requires a digitally controlled oscillator with a sufficiently low gain. In a digitally controlled oscillator, attaining a desirably low gain can be reduced to the ability to digitally control very small amounts of capacitance. However, known approaches to achieving sufficiently low gain in a digitally controlled oscillator suffer from various undesirable drawbacks.

In one approach, capacitors having appropriately small capacitances are switched in and out of a tank circuit of a digitally controlled oscillator in an attempt to achieve low gain. However, the parasitic capacitances of the switches ultimately limits the above approach and results in a digitally controlled oscillator having undesirably high gain. In another approach, a digital delta-sigma modulator is used to re-quantize the least significant bits of a control word to achieve a low gain digitally controlled oscillator. However, the digital delta-sigma modulator approach requires a sampling rate of 600.0 MHz or higher, which undesirably increases power consumption.

Thus, there is a need in the art for a digitally controlled oscillator having an appropriately low gain without a concomitant increase in power consumption.

SUMMARY OF THE INVENTION

The present invention is directed to capacitive tuning networks for low gain digitally controlled oscillators. The present invention overcomes the need in the art for a digitally controlled oscillator having an appropriately low gain without a concomitant increase in power consumption.

According to one exemplary embodiment, a digitally controlled oscillator includes a capacitive tuning network, where the capacitive tuning network controls a frequency of an output signal of the digitally controlled oscillator. The capacitive tuning network includes a switched capacitor array, where a change of a first capacitance of the switched capacitor array causes the capacitive tuning network to change by a second capacitance, and where the first capacitance is larger than the second capacitance. The first capacitance may cause a change of between approximately 400.0 Hz and approximately 500.0 Hz in the frequency of the output signal of the digitally controlled oscillator, for example.

According to this exemplary embodiment, the capacitive tuning network further includes a first capacitor coupled in parallel with the switched capacitor array. The first capacitor has a third capacitance, where the third capacitance is larger than the first capacitance. The capacitive tuning network further includes a second capacitor coupled in series with the first capacitor and the switched capacitor array. The second capacitor can have a fourth capacitance, where the third capacitance is larger than the fourth capacitance. The switched capacitor array includes at least one switched capacitor, where the switched capacitor array can be configured to couple the at least one switched capacitor with the first capacitor in a parallel configuration in response to a tuning control signal received by the digitally controlled oscillator. The switched capacitor array may further include at least one FET, where the at least one FET couples the at least one switched capacitor to the first capacitor in a parallel configuration, for example. Other features and advantages of the present invention will become more readily apparent to those of ordinary skill in the art after reviewing the following detailed description and accompanying drawings.

DETAILED DESCRIPTION OF THE INVENTION

The present invention is directed to capacitive tuning networks for low gain digitally controlled oscillators. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

The present invention provides an innovative capacitive tuning network that can be used to achieve a desirably low gain in a digitally controlled oscillator. Although a digitally controlled oscillator is utilized in the present embodiment to illustrate the invention, the present invention's capacitive tuning network can also be applied to other types of oscillators that are controlled by varying capacitance, such as voltage controlled oscillators.

Figure 1:
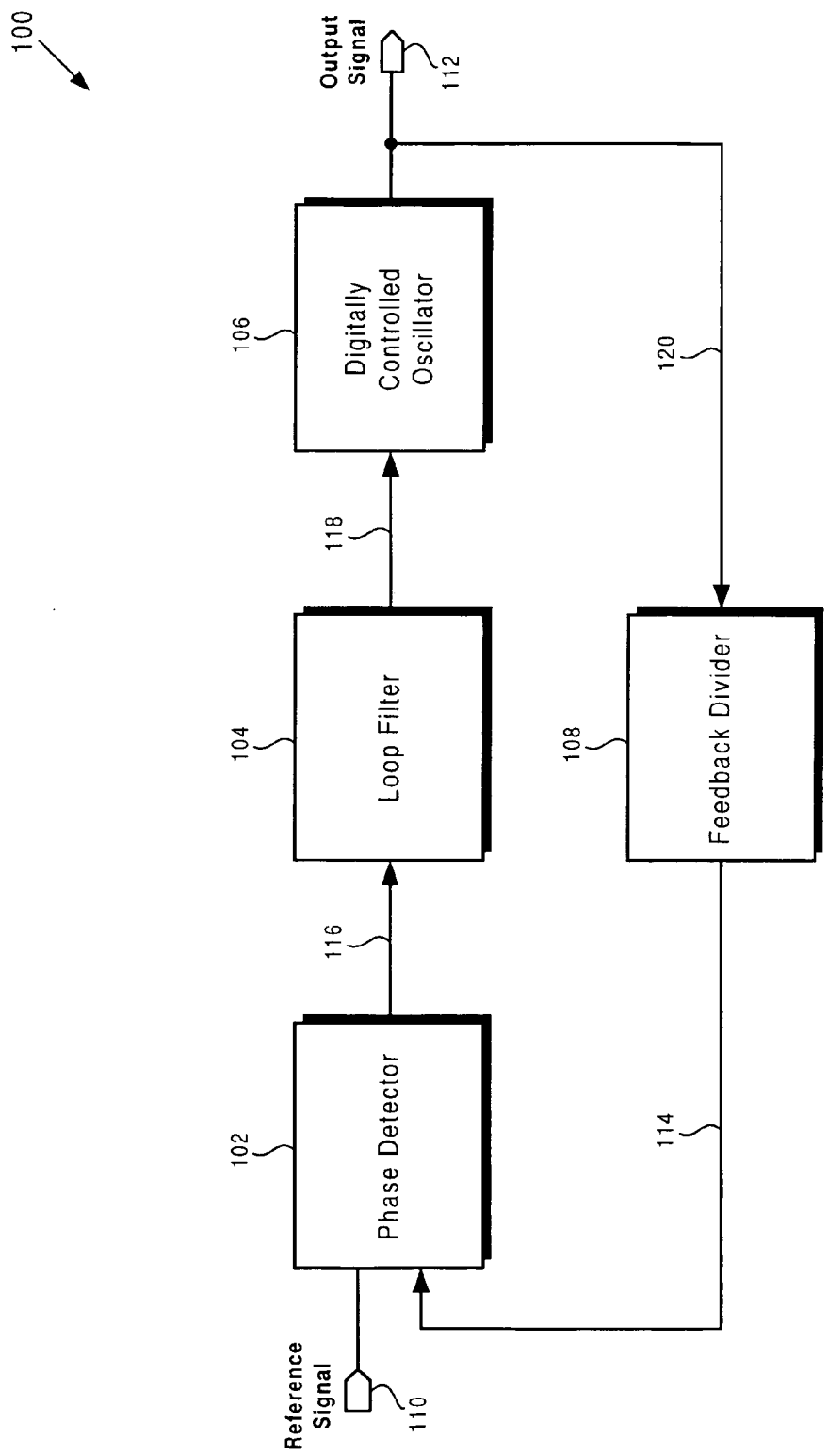
FIG. 1 is a block diagram of an exemplary phase locked loop including an exemplary digitally controlled oscillator in accordance with one embodiment of the present invention.

FIG. 1 shows a block diagram of an exemplary phase locked loop including an exemplary digitally controlled oscillator in accordance with one embodiment of the present invention. Certain details and features have been left out of FIG. 1 that are apparent to a person of ordinary skill in the art. Phase locked loop 100 includes phase detector 102, loop filter 104, digitally controlled oscillator 106, and feedback divider 108. Phase locked loop 100 can be an all-digital phase locked loop. In one embodiment, phase locked loop 100 can be a phase locked loop comprising one or more digital components, such as digitally controlled oscillator 106. Phase locked loop 100 can be configured to receive reference signal 110 and provide output signal 112, which is phase locked to reference signal 110.

As shown in FIG. 1, reference signal 110, which can be a digital reference signal, is coupled to one input of phase detector 102, and the output of feedback divider 108 is coupled to another input of phase detector 102 via line 114. Phase detector 102, which can be a digital phase detector, can be configured to receive reference signal 110 at one input and receive the output of feedback divider 108 at another input and provide a phase error signal, which corresponds to a difference in phase between reference signal 110 and the output of feedback divider 108, on line 116. Also shown in FIG. 1, the output of phase detector 102 is coupled to the input of loop filter 104 via line 116. Loop filter 104, which can be a digital loop filter, can be configured to receive the phase error signal outputted by phase detector 102, appropriately filter the phase error signal, and provide a tuning control signal on line 118.

Further shown in FIG. 1, the output of loop filter 104 is coupled to the input of digitally controlled oscillator 106 via line 118. Digitally controlled oscillator 106 can be configured to receive the tuning control signal, which is a digital tuning control signal, outputted on line 118 by loop filter 104 and provide output signal 112, which is phase locked to reference signal 110. Digitally controlled oscillator 106 includes the present invention's capacitive tuning network (not shown in FIG. 1), which achieves an appropriately small change in capacitance by switching a substantially larger capacitance in a switched capacitor array. By controlling the frequency of the output signal (i.e. output signal 112) of digitally controlled oscillator 106, the present invention's capacitive tuning network enables digitally controlled oscillator 106 to have a desirably low gain. The present invention's capacitive tuning network will be discussed below in relation to FIG. 2.

Also shown in FIG. 1, output signal 112, which is outputted by digitally controlled oscillator 106, is coupled to the input of feedback divider 108 on line 120. Feedback divider 108 can be configured to receive output signal 112 on line 120, divide output signal 112 by an appropriate integer in a manner known in the art, and provide the divided output signal to phase detector 102 on line 114.

Figure 2:
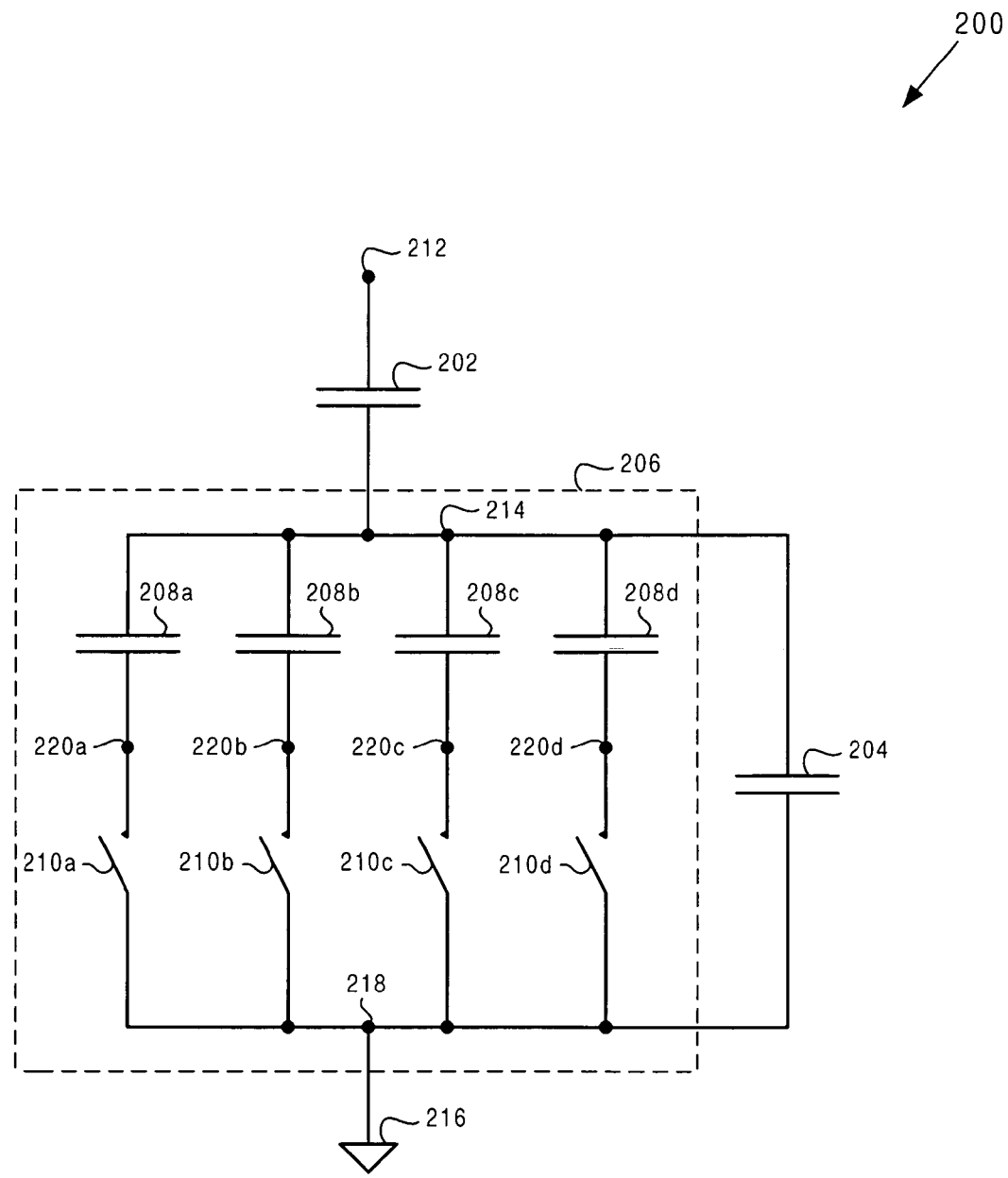
FIG. 2 illustrates a circuit diagram of an exemplary capacitive tuning network in accordance with one embodiment of the present invention.

FIG. 2 shows a schematic diagram of an exemplary capacitive tuning network in accordance with one embodiment of the present invention. Capacitive tuning network 200 can be situated in digitally controlled oscillator 106 in FIG. 1 and can be configured to control the frequency of an output signal generated by digitally controlled oscillator 106, such as output signal 112. Capacitive tuning network 200 includes capacitors 202 and 204 and switched capacitor array 206, which includes capacitors 208a, 208b, 208c, and 208d, and switches 210a, 210b, 210c, and 210d.

As shown in FIG. 2, a first terminal of capacitor 202 is coupled to node 212 and a second terminal of capacitor 202 is coupled to node 214. Capacitor 202 can be a metal-insulator-metal (MIM) capacitor or other appropriate type of capacitor. By way of example, the capacitance of capacitor 202 might be 50.0 femtofarads (fF). Node 212 can be coupled to a terminal of a tank circuit (not shown in FIG. 2) of digitally controlled oscillator 106 in FIG. 1. In an embodiment in which digitally controlled oscillator 106 generates differential outputs, node 212 may be coupled to two terminals of a tank circuit in digitally controlled oscillator 106. Also shown in FIG. 2, a first terminal of capacitor 204 is coupled to node 214 and a second terminal of capacitor 204 is coupled to reference voltage 216 at node 218. Capacitor 204 can be a MIM capacitor or other appropriate type of capacitor. By way of example, the capacitance of capacitor 204 might be 2.0 picofarads (pF). Reference voltage 216 can be, for example, a DC ground or a constant DC voltage with no AC component. In one embodiment, reference voltage 216 can be an AC ground.

Further shown in FIG. 2, first terminals of capacitors 208a, 208b, 208c, and 208d in switched capacitor array 206 are coupled to node 214 and second terminals of capacitors 208a, 208b, 208c, and 208d are coupled to first terminals of switches 210a, 210b, 210c, and 210d at nodes 220a, 220b, 220c, and 220d, respectively. It is noted that capacitors 208a, 208b, 208c, and 208d are also referred to as "switched capacitors" in the present application. Second terminals of switches 210a, 210b, 210c, and 210d are coupled to reference voltage 216 at node 218. In the present embodiment, capacitors 208a, 208b, 208c, and 208d can each have the same capacitance. By way of example, the capacitance of capacitors 208a, 208b, 208c, and 208d might be 10.0 fF. In other embodiments, capacitors 208a, 208b, 208c, and 208d may have any combination of appropriately selected capacitances.

Capacitors 208a, 208b, 208c, and 208d may each be a MIM capacitor or other appropriate type of capacitor. In one embodiment, capacitors 208a, 208b, 208c, and 208d may be controlled by a mismatch-shaping encoder. In one embodiment, capacitors 208a, 208b, 208c, and 208d may be binary weighted, which enables capacitive tuning network 200 to achieve an appropriately wide tuning range. Switches 210a, 210b, 210c, and 210d can each comprise a field effect transistor (FET), such as a PFET or an NFET, or other appropriate switching device.

The operation of capacitive tuning network 200 will now be discussed. Switched capacitor array 206 is configured such that capacitors 208a, 208b, 208c, and 208d are coupled at one end to node 214, and coupled at a second end to node 218 through respective switches 210a, 210b, 210c, and 210d. The capacitance of switched capacitor array 206 is controlled by selectively closing or opening switches 210a, 210b, 210c, and 210d, which activates or deactivates respective capacitors 208a, 208b, 208c, and 208d. By way of example, by closing switch 210a, capacitor 208a is activated, which causes the capacitance of switched capacitor array 206 to increase by an amount equal to the capacitance of capacitor 208a. Also, by closing switch 210a in the above example, capacitor 208a is coupled to capacitor 204 in a parallel configuration. By way of further example, assuming switch 210a is in a closed position, by opening switch 210a, capacitor 208a becomes deactivated, which causes the capacitance of switched capacitor array 206 to decrease by an amount equal to the capacitance of capacitor 208a.

Thus, by using four capacitors (i.e. capacitors 208a, 208b, 208c, and 208d), switched capacitor array 206 can provide 15 discrete capacitance steps. In other embodiments, switched capacitor array 206 may include one or more capacitors, such as capacitors 208a, 208b, 208c, and 208d, and one or more corresponding switches, such as switches 210a, 210b, 210c, 210d. Selection of switches 210a, 210b, 210c, and 210d can be provided by way of a selection circuit (not shown), which can enable (i.e. close) or disable (i.e. open) switches 210a, 210b, 210c, and 210d in response to a tuning control signal inputted into digitally controlled oscillator 106 in FIG. 1.

The equivalent capacitance ("$C_{eq}$") of capacitive tuning network 200 can be expressed by the equation:

$$C_{eq} \approx C_{var} \cdot \left(\frac{C_{top}}{C_0}\right)^2 \qquad \text{equation (1)}$$

where "$C_{top}$" is the capacitance of capacitor 202, "$C_0$" is the capacitance of capacitor 204, and "$C_{var}$" is the capacitance of switched capacitor array 206. In capacitive tuning network 200, $C_{top}$ and $C_0$ are fixed values, while $C_{var}$ is determined by capacitors 208a, 208b, 208c, and 208d as discussed above. As shown in equation (1), by selecting $C_0$ to be substantially larger than $C_{top}$, $C_{var}$ will be multiplied by a very small fraction. As a result, $C_{eq}$ (i.e. the equivalent capacitance of capacitive tuning network 200) will be substantially lower than $C_{var}$ (i.e. the capacitance of switched capacitor array 206). Thus, a change (i.e. an increase or decrease) in $C_{var}$ will cause a substantially smaller change in $C_{eq}$. By way of example, if $C_{top}$=50.0 fF, $C_0$=2.0 picofarads ("pF"), and $C_{var}$=10.0 fF in equation (1), $C_{eq}$ is approximately equal to 6.25 attofarads ("aF"). Thus, in the above example, a 10.0 fF increase in $C_{var}$ (i.e. the capacitance of switched capacitor array 206) causes a substantially smaller increase of 6.25 aF in $C_{eq}$.

Thus, in the present invention, by appropriately selecting $C_0$ to be substantially larger than $C_{top}$, $C_{var}$ can be appropriately increased or decreased to achieve a substantially smaller respective increase or decrease in $C_{eq}$. Also, $C_0$ can be selected to have a sufficiently large value such that parasitic capacitance at node 214 has a minimal effect on $C_{eq}$. Furthermore, $C_{var}$ can be appropriately selected such $C_{var}$ is substantially larger than the parasitic capacitance of switches 210a, 210b, 210c, and 210d at respective nodes 220a, 220b, 220c, and 220d. Thus, the present invention advantageously achieves a capacitive tuning network (i.e. capacitive tuning network 200) having substantially reduced sensitivity to parasitic capacitance.

Thus, by appropriately selecting $C_{var}$, $C_0$, and $C_{top}$ to provide an appropriately small change in $C_{eq}$, capacitive tuning network 200 can advantageously provide a desirably small change in the frequency of the output signal (i.e. output signal 112) generated by digitally controlled oscillator 106. By way of example, capacitive tuning network 200 may provide a step increase or decrease of between approximately 400.0 Hz and approximately 500.0 Hz in the frequency of output signal 112. Thus, the present invention's capacitive tuning network advantageously enables digitally controlled oscillator 106 to achieve a desirably low gain.

In contrast, a conventional digitally controlled oscillator that switches low value capacitors for frequency control is severely limited by switch parasitic capacitance. As a result, the conventional digitally controlled oscillator is unable to switch capacitors with sufficiently low values that are required to achieve a low gain.

Thus, as discussed above, by providing an appropriately larger change in capacitance of a switched capacitor array coupled in parallel with a larger capacitance, the present invention's capacitive tuning network advantageously achieves a substantially smaller change in equivalent capacitance. As a result, by using the present invention's capacitive tuning network to control the output frequency of a digitally controlled oscillator, the present invention advantageously achieves a digitally controlled oscillator having a desirably low gain.

Furthermore, the present invention's capacitive tuning network consumes a substantially minimal amount of power. Thus, the present invention achieves a digitally controlled oscillator that advantageously provides a desirably low gain without an undesirable increase in power consumption.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a capacitive tuning network for a low gain digitally controlled oscillator has been described.

The invention claimed is:

1. A digitally controlled oscillator comprising:
a capacitive tuning network, said capacitive tuning network controlling a frequency of an output signal of said digitally controlled oscillator;
said capacitive tuning network comprising a switched capacitor array, and a first capacitor coupled in parallel with said switched capacitor array, said capacitive tuning network further comprises a second capacitor coupled in series with said first capacitor and said switched capacitor array;
wherein a change of a first capacitance of said switched capacitor array causes said capacitive tuning network to change by a second capacitance, wherein said first capacitance is larger than said second capacitance.

2. The digitally controlled oscillator of claim 1 wherein said first capacitor has a third capacitance and said second capacitor has a fourth capacitance, wherein said third capacitance is larger than said fourth capacitance.

3. The digitally controlled oscillator of claim 1 wherein said switched capacitor array comprises at least one switched capacitor, said switched capacitor array being configured to couple said at least one switched capacitor with said first capacitor in a parallel configuration in response to a tuning control signal received by said digitally controlled oscillator.

4. The digitally controlled oscillator of claim 3 wherein said switched capacitor array further comprises at least one switch, said at least one switch coupling said at least one switched capacitor to said first capacitor in said parallel configuration in response to said tuning control signal.

5. The digitally controlled oscillator of claim 3 wherein said switched capacitor array further comprises at least one FET, said at least one FET coupling said at least one switched capacitor to said first capacitor in said parallel configuration.

6. The digitally controlled oscillator of claim 1 wherein said first capacitance causes a change of less than 500.0 Hz in said frequency of said output signal.

7. The digitally controlled oscillator of claim 1 wherein said capacitive tuning network causes said digitally controlled oscillator to have a low gain.

8. A phase locked loop comprising:
a digitally controlled oscillator, said digitally controlled oscillator configured to control a frequency of an output signal of said phase locked loop in response to a tuning control signal received by said digitally controlled oscillator;

said digitally controlled oscillator comprising a capacitive tuning network, said capacitive tuning network comprising a switched capacitor array, said switched capacitor array being configured to change by a first capacitance in response to said tuning control signal, said capacitive tuning network further comprising a first capacitor coupled in parallel with said switched capacitor array, and a second capacitor coupled in series with said first capacitor and said switched capacitor array;

wherein said first capacitance causes said capacitive tuning network to change by a second capacitance, wherein said first capacitance is larger than said second capacitance.

9. The phase locked loop of claim 8 wherein said first capacitor has a third capacitance, wherein said third capacitance is larger than said first capacitance.

10. The phase locked loop of claim 8 wherein said first capacitor has a third capacitance and said second capacitor has a fourth capacitance, wherein said third capacitance is larger than said fourth capacitance.

11. The phase locked loop of claim 8 wherein said switched capacitor array comprises at least one switched capacitor, said switched capacitor array being configured to couple said at least one switched capacitor to said first capacitor in a parallel configuration in response to said tuning control signal.

12. The phase locked loop of claim 11 wherein said switched capacitor array further comprises at least one FET, said at least one FET being configured to couple said at least one switched capacitor to said first capacitor in said parallel configuration in response to said tuning control signal.

13. The phase locked loop of claim 8 wherein said first capacitance causes a change of less than 500.0 Hz in said frequency of said output signal.

14. The phase locked loop of claim 8 further comprising a digital loop filter coupled to said digitally controlled oscillator, said digital loop filter providing said tuning control signal.

* * * * *